United States Patent
Cui et al.

(10) Patent No.: US 10,609,828 B2
(45) Date of Patent: Mar. 31, 2020

(54) ELASTIC SUPPORT STRUCTURE AND DISPLAY DEVICE INCLUDING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Ziwei Cui, Beijing (CN); Hongyan Xing, Beijing (CN); Jing Xue, Beijing (CN); Yanyan Yin, Beijing (CN); Yubing Song, Beijing (CN); Yue Gu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/531,013

(22) PCT Filed: Nov. 4, 2016

(86) PCT No.: PCT/CN2016/104612
§ 371 (c)(1),
(2) Date: May 26, 2017

(87) PCT Pub. No.: WO2017/118198
PCT Pub. Date: Jul. 13, 2017

(65) Prior Publication Data
US 2018/0317329 A1 Nov. 1, 2018

(30) Foreign Application Priority Data

Jan. 4, 2016 (CN) .......................... 2016 1 0005003

(51) Int. Cl.
*G02F 1/1333* (2006.01)
*H05K 5/00* (2006.01)
(Continued)

(52) U.S. Cl.
CPC ........... *H05K 5/0017* (2013.01); *F16F 1/373* (2013.01); *F16F 15/04* (2013.01); *F16F 15/08* (2013.01);
(Continued)

(58) Field of Classification Search
USPC .......................................... 349/60
See application file for complete search history.

(56) References Cited

U.S. PATENT DOCUMENTS 3,222,697 A * 12/1965 Scheermesser ...... A47C 27/144
297/452.48
3,948,500 A * 4/1976 Korbuly .................... E02B 3/26
267/140

(Continued)

FOREIGN PATENT DOCUMENTS

| CN | 101164835 A | 4/2008 |
|---|---|---|
| CN | 201092424 Y | 7/2008 |

(Continued)

OTHER PUBLICATIONS

First Office Action for Chinese Application No. 201610005003.3, dated Aug. 8, 2017, 8 Pages.
(Continued)

*Primary Examiner* — Rodney E Fuller
(74) *Attorney, Agent, or Firm* — Brooks Kushman P.C.

(57) ABSTRACT

An elastic support structure for a display module and a display device including the elastic support structure are provided. The elastic support structure includes a first support member and a second support member. A first angle is formed between the first support member and the second
(Continued)

support member, and the first angle is variable, so as to enable the elastic support structure to provide elastic support. The elastic support structures are arranged at an identical interval between an outer frame of a back plate and an inner frame of a housing, so as to support the display module.

19 Claims, 6 Drawing Sheets

(51) Int. Cl.

| | | |
|---|---|---|
| *F16F 15/04* | (2006.01) | |
| *G06F 1/16* | (2006.01) | |
| *F16F 1/373* | (2006.01) | |
| *F16F 15/08* | (2006.01) | |
| *H05K 5/02* | (2006.01) | |
| *B32B 3/28* | (2006.01) | |
| *B32B 3/30* | (2006.01) | |

(52) U.S. Cl.
CPC ...... *G02F 1/133308* (2013.01); *G06F 1/1637* (2013.01); *G06F 1/1656* (2013.01); *H05K 5/0217* (2013.01); *B32B 3/28* (2013.01); *B32B 3/30* (2013.01); *G02F 2001/133314* (2013.01); *G02F 2201/503* (2013.01)

(56) References Cited

U.S. PATENT DOCUMENTS

| | | | | |
|---|---|---|---|---|
| 4,485,505 A | * | 12/1984 | Paul | A47C 21/046 5/706 |
| 4,967,433 A | * | 11/1990 | Neal | A47C 27/146 5/655.9 |
| 6,050,417 A | * | 4/2000 | Smith | B65D 81/02 206/521 |
| 6,250,617 B1 | * | 6/2001 | Tews | F16F 1/371 213/7 |
| 6,704,961 B2 | * | 3/2004 | Kienlein | A47C 7/503 5/724 |
| 6,809,916 B2 | * | 10/2004 | Nakata | F16F 1/025 361/115 |
| 6,859,357 B2 | * | 2/2005 | Morimoto | G06F 1/1616 248/917 |
| 8,297,601 B2 | * | 10/2012 | Vito | A43B 7/32 267/140.11 |
| 9,129,659 B2 | * | 9/2015 | Montevirgen | G11B 33/08 |
| 2003/0046849 A1 | * | 3/2003 | Lin | G02F 1/133308 40/792 |
| 2005/0144808 A1 | * | 7/2005 | Vito | B25F 5/006 36/71 |
| 2008/0007971 A1 | | 1/2008 | Hsieh | |
| 2009/0256992 A1 | | 10/2009 | Huang | |
| 2010/0183847 A1 | * | 7/2010 | Pearce | B32B 3/28 428/158 |
| 2010/0291974 A1 | | 11/2010 | Lu et al. | |
| 2010/0300742 A1 | * | 12/2010 | Ihara | H01R 12/57 174/261 |
| 2014/0104538 A1 | * | 4/2014 | Park | G02F 1/133608 349/60 |
| 2016/0118616 A1 | * | 4/2016 | Hiroki | H01L 51/0097 257/40 |
| 2016/0192791 A1 | * | 7/2016 | Gao | A47G 1/14 40/714 |

FOREIGN PATENT DOCUMENTS

| | | |
|---|---|---|
| CN | 101659332 A | 3/2010 |
| CN | 102730260 A | 10/2012 |
| CN | 103387088 A | 11/2013 |
| CN | 103529593 A | 1/2014 |
| CN | 204557007 U | 8/2015 |
| CN | 105523281 A | 4/2016 |
| DE | 4408317 A1 | 9/1995 |
| JP | 2008170572 A | 7/2008 |
| KR | 20090017295 A | 2/2009 |

OTHER PUBLICATIONS

International Search Report and Written Opinion for Application No. PCT/CN2016/104612, dated Feb. 6, 2017, 12 Pages.

* cited by examiner

--Prior Art--

ELASTIC SUPPORT STRUCTURE AND DISPLAY DEVICE INCLUDING THE SAME

CROSS-REFERENCE TO RELATED APPLICATIONS

This application is the U.S. national phase of PCT Application No. PCT/CN2016/104612 filed on Nov. 4, 2016, which claims priority to Chinese Patent Application No. 201610005003.3 filed on Jan. 4, 2016, the disclosures of which are incorporated in their entirety by reference herein.

TECHNICAL FIELD

The present disclosure relates to the field of display manufacture technology, and in particular to an elastic support structure and a display device including the elastic support structure.

BACKGROUND

As competition in the whole-machine market increases, more and more demands on the structures and performances of mobile phones and their modules. During the manufacture or transportation of a display module, an external force may inevitably be applied to the display module, resulting in deformation and breakage. As a result, a final assembling procedure or the product quality during the transportation may be adversely affected.

SUMMARY

An object of the present disclosure is to provide an elastic support structure applied to the display module and having a good anti-pressure capability and buffering capability.

The present disclosure provides in some embodiments an elastic support structure for a display module, including at least one first support member and at least one second support member. A first angle is formed between the first support member and the second support member, the first angle is variable, to enable the elastic support structure to provide elastic support. Through the first variable angle, the elastic support structure may be deformed in a recoverable manner to some extent. In addition, due to the two support members, the elastic support structure may bear an external force applied thereto from two sides, thereby improving its anti-pressure capability and buffering capability.

Optionally, the elastic support structure includes a plurality of first support members and a plurality of second support members, every two adjacent first support members are connected to each other via one of the second support members, every two adjacent second support members are connected to each other via one of the first support members, and the plurality of first support members and the plurality of second support members are formed integrally.

Due to the plurality of first support members and the plurality of second support members as well as the plurality of first variable angles, it is able to reduce a deformation degree of the elastic support member in a better manner, thereby to improve its anti-pressure capability and buffering capability.

Optionally, at least one of the second support members includes a free end, the second support member having the free end includes a bending portion, and a second angle is formed at a bending position of the bending portion. In this way, it is able for further improve the anti-pressure capability and the buffering capability.

Optionally, in an initial state where no external force is applied, among the plurality of first angles, each odd-numbered first angle is of a first value, and each even-numbered first angles is of a second value. In this way, it is able for the elastic support structure to provide uniform elastic support.

Optionally, each of the first angles is within a range of 40° to 70°.

Optionally, each of the first angles is 47° or 62°.

Optionally, in the initial state where no external force is applied, an opening direction of the second angle is identical to the first angle formed between the second support member with the bending portion and the first support member connected thereto, and the second angle is within a range of 60° to 90°.

Optionally, in the initial state where no external force is applied, an opening direction of the second angle is opposite to the first angle formed between the second support member with the bending portion and the first support member connected thereto, and the second angle is within a range of 100° to 135°.

Optionally, at least one of the second support members includes a free end, and the second support member having the free end includes a spring. Due to the spring which has an excellent supporting capability and anti-pressure and buffering capability, it is able to further improve the anti-pressure and buffering capability of the elastic support structure.

Optionally, the first angle is rounded.

Optionally, the second angle is rounded.

Through the rounded angle, it is able improve the elasticity of the elastic support structure, thereby to reduce the deformation of the elastic support structure due to the external force applied thereto (e.g., the external force applied by an operator) during the assembly of the display module.

Optionally, the elastic support structure includes a fixation member arranged at one end of the elastic support structure or at an outer vertex of the first angle of the elastic support structure.

Through the fixation member, the elastic support structure may be conveniently and firmly connected to a to-be-supported structure of the display module.

Optionally, the elastic support structure is made of an electrically conductive material. In this way, it is able for the elastic support structure to release static charges accumulated in the display module.

The present disclosure further provides in some embodiments a display module including a back plate and the above-mentioned elastic support structure connected to an outer frame of the back plate at one end of the elastic support structure or at an outer vertex of a first angle of the elastic support structure.

Optionally, the elastic support structure is formed integrally with the back plate.

Optionally, the display module further includes a plurality of elastic support structures arranged at an identical interval on the outer frame of the back plate so as to support modules. In the case of an external force, the plurality of elastic support structures may function together to improve the anti-vibration performance and anti-pressure performance.

The present disclosure further provides in some embodiments a display device including a housing, a back plate and the above-mentioned elastic support structure connected to an inner frame of the housing at one end of the elastic support structure or at an outer vertex of a first angle of the elastic support structure.

Optionally, the elastic support structure is formed integrally with the housing.

Optionally, the display device further includes a plurality of elastic support structures arranged at an identical interval on the inner frame of the housing so as to support modules. In the case of an external force, the plurality of elastic support structures may function together to improve the anti-vibration performance and compression resistance performance.

According to the elastic support structure and the display device including the elastic support structure in the embodiments of the present disclosure, it is able to prevent the display module from being damaged due to the external force during the manufacture or transportation, thereby to improve the yield of the product.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

Figure 1:
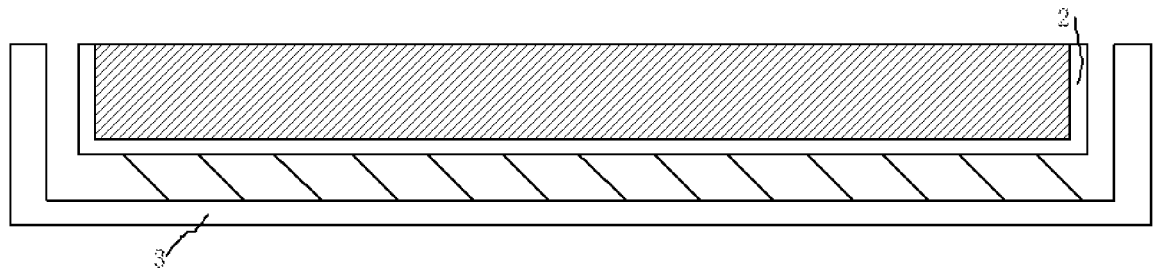
FIG. 1 is a schematic view showing a display module having an elastic sheet structure in the related art.

REFERENCE SIGN LIST 1 elastic support structure
1' elastic support structure that is elastically deformed
101 first support member
102 second support member
103 first angle
104 bending portion
105 second angle
1061 angle fixation member 1061
1062 end fixation member
2 back plate
3 housing
4 first flat portion
4' first flat portion after position change
5 second flat portion

DETAILED DESCRIPTION

The present disclosure will be described hereinafter in conjunction with the drawings and embodiments. The following embodiments are for illustrative purposes only, but shall not be used to limit the scope of the present disclosure.

As shown in FIG. 1, which is a schematic view showing a display module having an elastic sheet structure in the related art, the elastic sheet structure includes an elastic sheet, one end of which is connected to an outer frame of a back plate 2, and another end of which is connected to or in contact with an inner frame of a housing 3.

During the transportation and assembly, an external force may be applied to the display module, e.g., the display module may collide with the other substance. The elastic sheet structure in FIG. 1 may be arranged between the back plate and the housing of the display module, so as to function as a support and an elastic cushion. However, the elastic sheet structure in FIG. 1 merely includes one support member in a straight form, and its buffering capability is limited. In the case of the strong external force, the elastic sheet structure may easily be deformed in a unrecoverable manner. Hence, the product quality will be adversely affected during the assembly and transportation.

Figure 2:
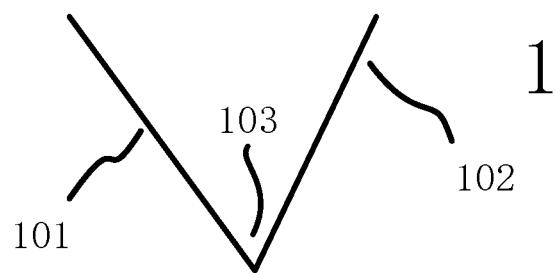
FIG. 2 is a schematic view showing an elastic support structure in some embodiments of the present disclosure.

The present disclosure provides in some embodiments an elastic support structure 1 which, as shown in FIG. 2, includes a first support member 101 and a second support member 102. A first variable angle 103 is formed between the first support member 101 and the second support member 102, so as to enable the elastic support structure to provide elastic support. Through the first variable angle 103, the elastic support structure 1 may be deformed in a recoverable manner to some extent. In addition, due to the two support members, the elastic support structure may bear an external force applied thereto from two sides. As a result, it is able to improve its buffering capability and anti-pressure capability.

Figure 3:
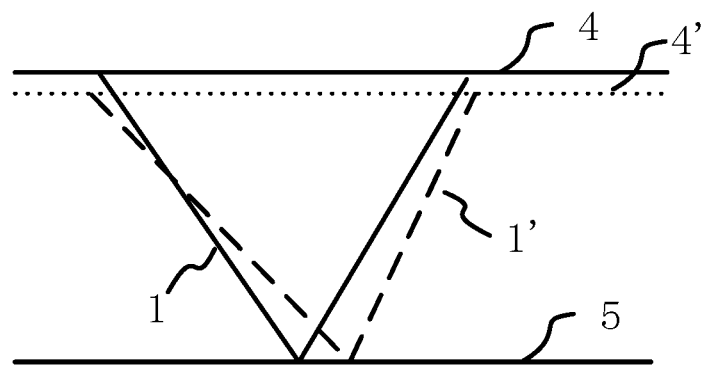
FIG. 3 is a schematic view showing an operation mode of the elastic support structure in some embodiments of the present disclosure.

FIG. 3 is a schematic view showing an operation mode of the elastic support structure. The elastic support structure is configured to provide the elastic support between a first flat portion 4 and a second flat portion 5. A free end of the first support member 101 is connected to a lower surface of the first flat portion 4, and an outer vertex of the first angle 103 is in contact with an upper surface of the second flat portion 5. In an initial state where no external force is applied, such a structure similar to an unclosed triangular structure is formed between the elastic support structure 1 and the first flat panel 4 (the second support member is not in contact with the first flat portion 4). In the case of the external force, a distance between the first flat portion 4 and the second flat portion 5 may decrease, e.g., in FIG. 3, the first flat portion 4 may move downward to a first flat portion 4' after position change, and the second support member 102 of the elastic support structure 1 may be in contact with a lower surface of the first flat portion 4'. At this time, the outer vertex of the first angle may move to the right along the upper surface of the second flat portion 5, and meanwhile the first angle may change, i.e., the elastic support structure may be elastically deformed, so as to form an elastic support structure 1' as shown in FIG. 2.

In some embodiments of the present disclosure, for the elastic support structure, the free end of the first support member 101 refers to an end not connected to the second support member 102. In the case that the elastic support structure is connected to any other device or member, this end may also be called as the free end. For example, in the case that the elastic support structure is applied for a back plate of a display module, one end of the first support member 101 may be in contact with, directly connected to, or fixedly connected through any other structure to the back plate 2, and at this time, this end may also be called as the free end of the first support member 101.

In some cases, as compared with the initial state, a value of the first angle 103 may be changed at an amount of 2° to 5°, but the angle change will not be particularly limited herein.

Figure 4A:
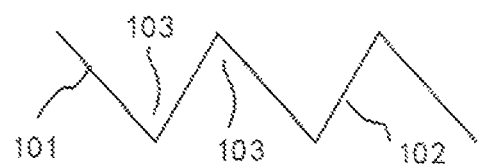
FIG. 4a is another schematic view showing the elastic support structure in some embodiments of the present disclosure.

In some embodiments of the present disclosure, the elastic support structure 1 may include two or more first support members 101, and every two adjacent first support members 101 may be connected to each other through one second support member 102 which is integrally formed with the first support members 101, as shown in FIG. 4a.

Figure 4B:
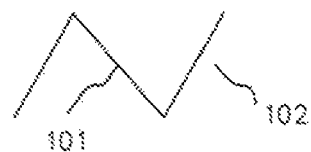
FIG. 4b is yet another schematic view showing the elastic support structure in some embodiments of the present disclosure.

Optionally, the elastic support structure 1 may include two or more second support members 102, and every two adjacent second support members 102 are connected to each other through one first support member 101 which is integrally formed with the second support members 102, as shown in FIG. 4b.

Figure 4C:
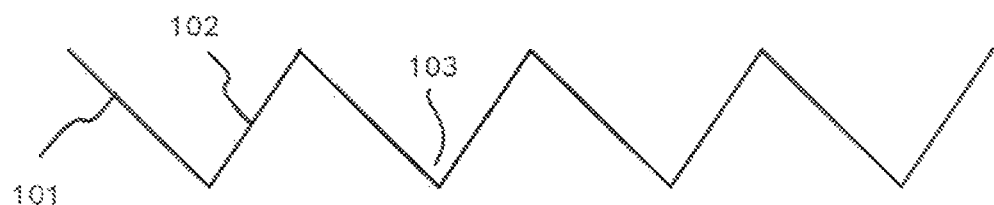
FIG. 4c is still yet another schematic view showing the elastic support structure in some embodiments of the present disclosure.

Optionally, the elastic support structure 1 may include two or more first support members 101 and two or more second support members 102. Every two adjacent first support members 101 are connected to each other through one second support member 102 which is integrally formed with the first support members 101, and every two adjacent second support members 102 are connected to each other through one first support member 101 which is integrally formed with the second support members 102, as shown in FIG. 4c.

Due to the plurality of first support members 101 and/or the plurality of second support members 102 as well as the plurality of first variable angles 103, it is able for the elastic support structure 1 to reduce its deformation degree in a better manner, thereby to improve its anti-pressure capability and buffering capability.

Figure 5A:
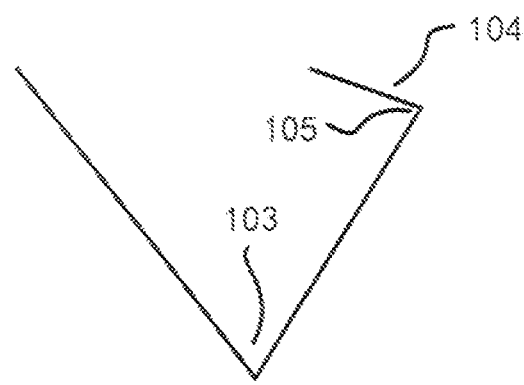
FIG. 5a is still yet another schematic view showing the elastic support structure in some embodiments of the present disclosure.

In some embodiments of the present disclosure, as shown in FIG. 5a, the second support member 102 having the free end may include a bending portion 104, and a second angle 105 may be formed at a bending position of the bending portion 104.

Figure 5B:
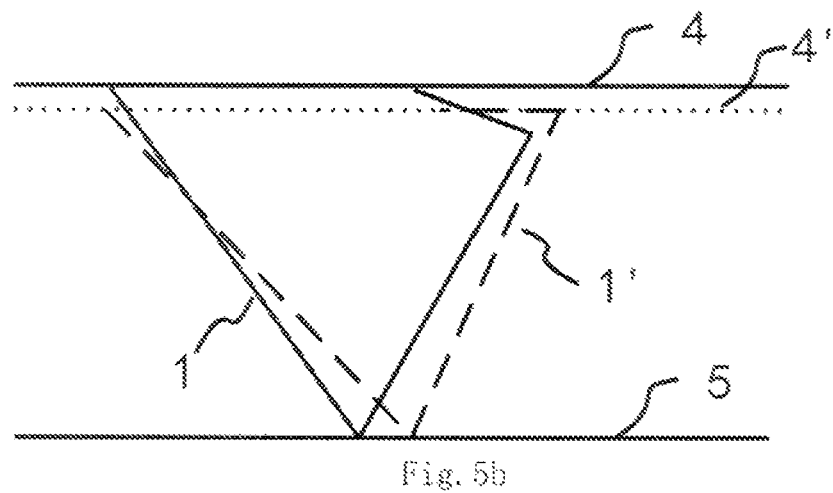
FIG. 5b is another schematic view showing the operation mode of the elastic support structure in some embodiments of the present disclosure.

FIG. 5b is another schematic view showing the operation mode of the elastic support structure. The elastic support structure 1 is configured to provide elastic support between the first flat portion 4 and the second flat portion 5. The free end of the first support member 101 is connected to the lower surface of the first flat portion 4, and the outer vertex of the first angle 103 is in contact with the upper surface of the second flat portion 5. In the case of the external force, a distance between the first flat portion 4 and the second flat portion 5 may decrease, e.g., the first flat portion 4 may move downward to form the first flat portion 4' after position change. The outer vertex of the first angle 103 may move along the upper surface of the second flat portion 5, and meanwhile the value of the first angel 103 may change. At this time, the bending portion 104 may be in contact with the first flat portion 4' after the position change. Because the bending portion 104 (i.e., a surface), rather than the outer vertex (i.e., a point) of the first angle 103, is in contact with the first flat portion, it is able for the entire elastic support structure 1 to bear the force from the first flat portion 4 in a better manner, thereby to further improve its buffering capability and anti-pressure capability.

In some embodiments of the present disclosure, in the initial state where no external force is applied, among the plurality of first angles 103, the odd-numbered first angles 103 are of a first value, and the even-numbered first angles 103 are of a second value. In this way, it is able for the elastic support structure to provide the elastic support in a more uniform manner.

In addition, the first value may be different from the second value. In a possible embodiment of the present disclosure, the odd-numbered first angles 103 may be of different values or parts of the odd-numbered first angles 103 may be of an identical value, and the even-numbered first angles 103 may be of different values or parts of the even-numbered first angles 103 may be of an identical value, which will not be particularly defined herein.

In some embodiments of the present disclosure, in the initial state where no external force is applied, each of the first angles may be within the range of 40° to 70°. In this way, it is able for the elastic support structure to provide elastic support in a better manner, and to improve its buffering capability in the case of the external force.

In some embodiments of the present disclosure, in the initial state where no external force is applied, each of the first angles may be 47° or 62°. In the case that the first angle is 47°, a ratio of a length of the first support member to a length of the second support member is 1.414:1. At this time, in the case that the elastic support structure is elastically deformed in such a manner that the first angle is 45°, an isosceles right triangle may be formed by the elastic support structure and the flat portion to be supported. This structure is more stable, so it is able to achieve the support and buffering effect of the elastic support structure in a better manner.

In the case that the first angle is 62°, a ratio of the length of the first support member to the length of the second support member is 1:1. At this time, in the case that the elastic support structure is elastically deformed in such a manner that the first angle is 60°, an isosceles triangle may be formed by the elastic support structure and the flat portion to be supported. This structure is stable, so it is able to achieve the support and buffering effect of the elastic support structure in a better manner.

In some embodiments of the present disclosure, in the initial state where no external force is applied, the second angle may be opened toward the first support member, and it may be within the range of 60° to 90°, e.g., 90°. In a possible embodiment of the present disclosure, the second angle may be opened in a direction away from the first support member, and it may be within the range of 100° to 135°, e.g., 120°.

Figure 6A:
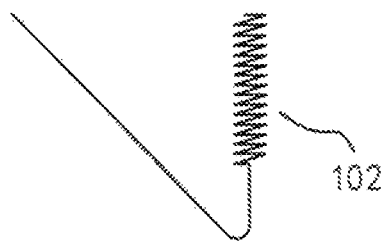
FIG. 6a is still yet another schematic view showing the elastic support structure in some embodiments of the present disclosure.

In some embodiments of the present disclosure, as shown in FIG. 6a, the second support member 102 having a free end may include a spring.

In some embodiments of the present disclosure, for the elastic support structure 1, the free end of the second support member 102 refers to an end not connected to the first support member 101. In the case that the elastic support structure 1 is connected to any other device or member, this end may also be called as the free end. For example, in the case that the elastic support structure is applied to the back plate of the display module, one end of the second support member 102 may be in contact with, directly connected to or fixedly connected through any other structure to the back plate, and this end may also be called as the free end of the second support member 102.

Figure 6B:
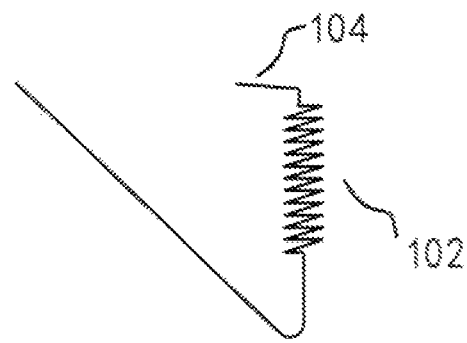
FIG. 6b is still yet another schematic view showing the elastic support structure in some embodiments of the present disclosure.
Figure 6C:
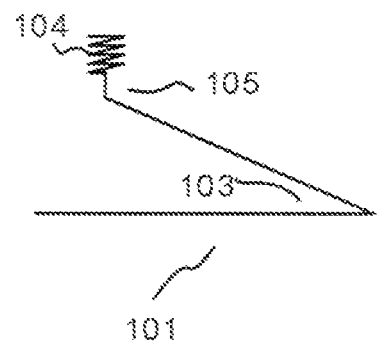
FIG. 6c is still yet another schematic view showing the elastic support structure in some embodiments of the present disclosure.

In some embodiments of the present disclosure, the second support member 102 having the free end may include both the bending portion and the spring. To be specific, as shown in FIG. 6b, the spring may be arranged at a non-bending portion of the second support member 102, or as shown in FIG. 6c, the spring may be arranged at the bending portion 104 of the second support member 102.

Because the spring has an excellent supporting capability and buffering and anti-pressure capability, it is able for the elastic support structure to improve the buffering capability and the anti-pressure performance.

Figure 7:
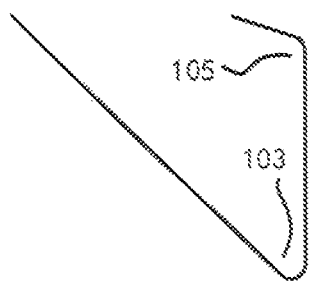
FIG. 7 is still yet another schematic view showing the elastic support structure in some embodiments of the present disclosure.

In some embodiments of the present disclosure, as shown in FIG. 7, the second angle 105 is rounded. Through the rounded angle, it is able improve the elasticity of the elastic support structure, thereby to reduce the deformation of the elastic support structure due to the external force applied thereto (e.g., the external force applied by an operator) during the assembly of the display module.

Figure 8A:
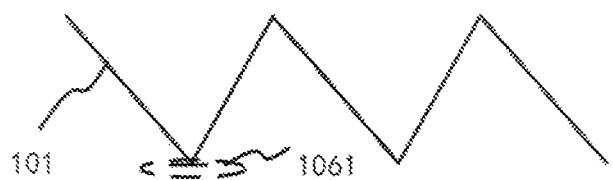
FIG. 8a is still yet another schematic view showing the elastic support structure in some embodiments of the present disclosure.
Figure 8B:
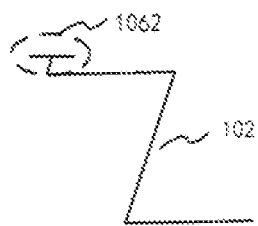
FIG. 8b is still yet another schematic view showing the elastic support structure in some embodiments of the present disclosure.
Figure 8C:
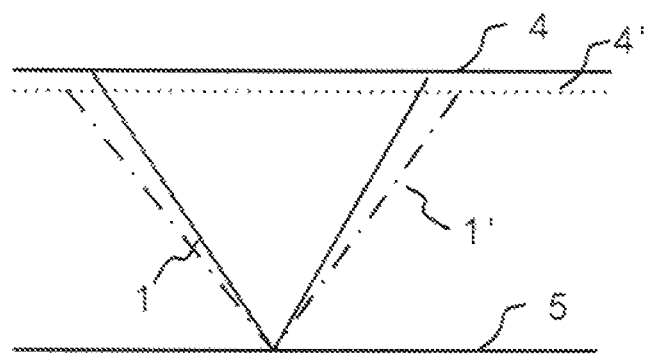
FIG. 8c is still yet another schematic view showing the elastic support structure in some embodiments of the present disclosure.

In some embodiments of the present disclosure, the elastic support structure may include a fixation member configured to connect the elastic support structure to a to-be-supported structure of the display module. The fixation member may be arranged at any end of the elastic support structure or at an outer vertex of any of the first angle. For example, as shown in FIG. 8a, the fixation member of the elastic support structure 1 is an angle fixation member 1061, and it is located at the outer vertex of the first angle 103. Through the angle fixation member 1061, the elastic support structure 1 may be conveniently and firmly connected to the to-be-supported structure of the display module. For another example, as shown in FIG. 8b, the fixation member of the elastic support structure 1 is an end fixation member 1062, and it is located at the free end of the first support member 101. Through the end fixation member 1062, the elastic support structure 1 may be conveniently and firmly connected to the to-be-supported structure of the display module. FIG. 8c shows the operation mode of the elastic support structure having the fixation member. In the initial state where no external force is applied, the outer vertex of the first angle 103 may be connected to the second flat portion 5 through the fixation member. In the case of the external force, the distance between the first flat portion 4 and the second flat portion 5 may decrease, e.g., the first flat portion 4 may move downward to form the second flat portion 4' after change position, and the free ends of the first support member 101 and the second support member 102 may move along the lower surface of the first flat portion 4'. In addition, the first angel 103 may change, i.e., the elastic support structure 1' in FIG. 8c may be acquired after the elastic deformation, so as to cushion the external force.

In some embodiments of the present disclosure, the fixation member of the elastic support member may be formed integrally with the first support member and the second support member.

In some embodiments of the present disclosure, the elastic support structure may be made of an electrically conductive material, so as to release static charges accumulated in the display module. In a possible embodiment of the present disclosure, the electrically conductive material may be aluminum, copper or an alloy of aluminum and iron. The first support member 101 and the second support member 102 may each be of a sheet-like shape or a thin cylindrical shape. In a possible embodiment of the present disclosure, the first support member and the second support member may be of a strip and sheet-like shape, so as to provide the elastic support in a better manner.

The present disclosure further provides in some embodiments a display module including a back plate and the above-mentioned elastic support structure connected to an outer frame of the back plate at one end thereof or at an outer vertex of the first angle.

In some embodiments of the present disclosure, the elastic support structure may be formed integrally with the back plate.

In some embodiments of the present disclosure, a plurality of elastic support structures may be arranged at an identical interval on the outer frame of the back plate so as to support modules. In the case of an external force, the plurality of elastic support structures may function together to improve the anti-vibration performance and anti-pressure performance.

The present disclosure further provides in some embodiments a display device including a housing, a display module and the above-mentioned elastic support structure connected to an inner frame of the housing at one end thereof or at an outer vertex of the first angle.

In some embodiments of the present disclosure, the elastic support structure may be formed integrally with the housing.

In some embodiments of the present disclosure, a plurality of elastic support structures may be arranged at an identical interval on an inner frame of the housing so as to support modules. In the case of an external force, the plurality of elastic support structures may function together to improve the anti-vibration performance and anti-pressure performance.

Figure 9A:
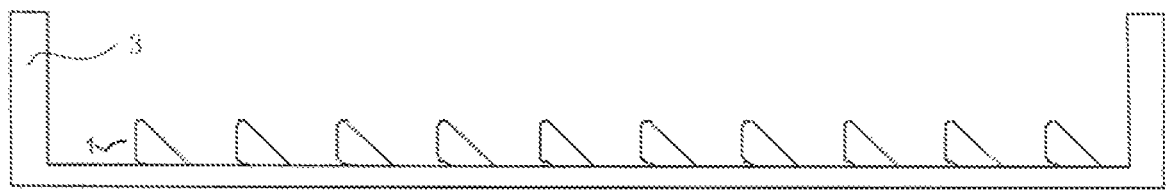
FIG. 9a is schematic view showing a connection mode between the elastic support structure and a housing in some embodiments of the present disclosure.

As shown in FIG. 9a which is a schematic view showing a connection mode between the housing 3 and the elastic support structures, the plurality of elastic support structures 1 are arranged at an identical interval, and the housing 3 is formed integrally with the elastic support structures 1 or the free end of the first support member of each elastic support structure 1 is connected to the inner frame of the housing 3.

In the case of the external force, it is able for the elastic support structures 1 to improve the anti-vibration performance and anti-pressure performance.

Figure 9B:
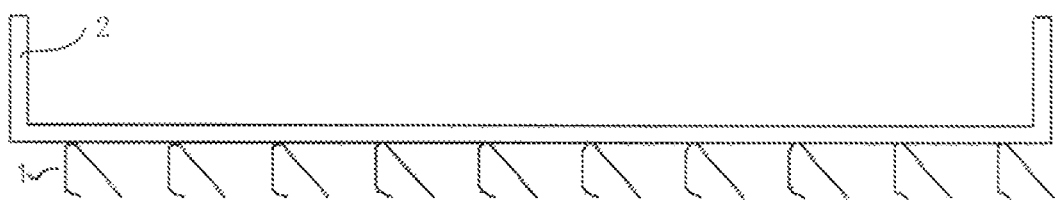
FIG. 9b is a schematic view showing a connection mode between the elastic support structure and a back plate in some embodiments of the present disclosure.

As shown in FIG. 9b which is a schematic view showing a connection mode between the back plate 2 and the elastic support structures, the plurality of elastic support structures 1 are arranged at an identical interval, and the back plate 2 is formed integrally with the elastic support structures 1 or the outer vertex of the first angle is connected to the outer frame of the back plate 2. In the case of the external force, it is able for the elastic support structures 1 to improve the anti-vibration performance and anti-pressure performance.

Figure 9C:
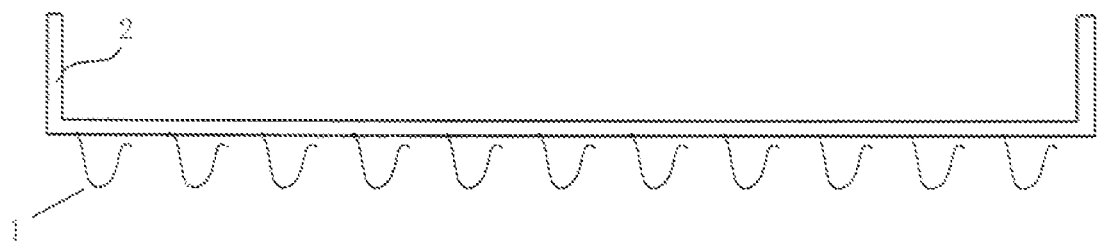
FIG. 9c is another schematic view showing the connection mode between the elastic support structure and the back plate in some embodiments of the present disclosure.

As shown in FIG. 9c which is another schematic view showing the connection mode between the back plate 2 and the elastic support structure, the plurality of elastic support structures 1 are arranged at an identical interval, and the back plate 2 is formed integrally with the elastic support structures 1 or the free end of the first support member of each elastic support structure 1 is connected to the outer frame of the back plate 2. In the case of the external force, it is able for the elastic support structures 1 to improve the anti-vibration performance and anti-pressure performance.

Figure 9D:
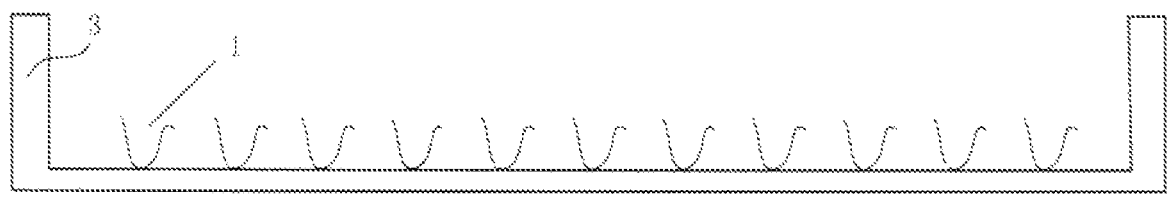
FIG. 9d is another schematic view showing the connection mode between the elastic support structure and the housing in some embodiments of the present disclosure.

As shown in FIG. 9d which is another schematic view showing the connection mode between the housing 3 and the elastic support structures, the plurality of elastic support structures 1 are arranged at an identical interval, and the housing 3 is formed integrally with the elastic support structures 1 or the outer vertex of the first angle is connected to the inner frame of the housing 3. In the case of the external force, it is able for the elastic support structures 1 to improve the anti-vibration performance and anti-pressure performance.

The display device includes the elastic support structure, and in the case of the external force applied to the display module, the distance between the back plate and the housing may decrease, so as to improve the anti-vibration performance and anti-pressure performance.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An elastic support structure for a display module, comprising at least one first support member and at least one second support member, wherein the first support member is formed integrally with the second support member, and a first angle is formed between the first support member and the second support member, the first angle is variable, to enable the elastic support structure to provide elastic support;

wherein each of the first angles is within a range of 40° to 70°, in an initial state where no external force is applied.

2. The elastic support structure according to claim 1, further comprising a plurality of first support members and a plurality of second support members, every two adjacent first support members are connected to each other via one of the second support members, every two adjacent second support members are connected to each other via one of the first support members, and the plurality of first support members and the plurality of second support members are formed integrally.

3. The elastic support structure according to claim 2, wherein among a plurality of first angles, each odd-numbered first angle is of a first value, and each even-numbered first angle is of a second value, in the initial state where no external force is applied.

4. The elastic support structure according to claim 1, wherein at least one of the second support members comprises a free end, the second support member having the free end comprises a bending portion, and a second angle is formed at a bending position of the bending portion.

5. The elastic support structure according to claim 4, wherein an opening direction of the second angle is identical to the first angle formed between the second support member with the bending portion and the first support member connected thereto, and the second angle is within a range of 60° to 90°, in the initial state where no external force is applied.

6. The elastic support structure according to claim 4, wherein an opening direction of the second angle is opposite to the first angle formed between the second support member with the bending portion and the first support member connected thereto, and the second angle is within a range of 100° to 135°, in the initial state where no external force is applied.

7. The elastic support structure according to claim 4, wherein the second angle is rounded.

8. The elastic support structure according to claim 1, wherein each of the first angles is 47° or 62°, in the initial state where no external force is applied.

9. The elastic support structure according to claim 1, wherein at least one of the second support members comprises a free end, and the second support member having the free end comprises a spring.

10. The elastic support structure according to claim 1, wherein the first angle is rounded.

11. The elastic support structure according to claim 1, further comprising a fixation member arranged at one end of the elastic support structure or at an outer vertex of the first angle of the elastic support structure.

12. The elastic support structure according to claim 11, wherein the fixation member is formed integrally with the first support member and the second support member.

13. The elastic support structure according to claim 1, wherein the elastic support structure is made of an electrically conductive material.

14. A display module, comprising a back plate and the elastic support structure according to claim 1, wherein the elastic support structure is connected to an outer frame of the back plate at one end of the elastic support structure or at an outer vertex of a first angle of the elastic support structure.

15. The display module according to claim 14, wherein the elastic support structure is formed integrally with the back plate.

16. The display module according to claim 14, further comprising a plurality of elastic support structures arranged at an identical interval on the outer frame of the back plate.

17. A display device, comprising a housing, a display module and the elastic support structure according to claim 1, wherein the elastic support structure is connected to an inner frame of the housing at one end of the elastic support structure or at an outer vertex of a first angle of the elastic support structure.

18. The display device according to claim 17, wherein the elastic support structure is formed integrally with the housing.

19. The display device according to claim 17, further comprising a plurality of elastic support structures arranged at an identical interval on the inner frame of the housing.

* * * * *